United States Patent
Hoffman et al.

[11] Patent Number: 5,846,386
[45] Date of Patent: *Dec. 8, 1998

[54] ON-SITE AMMONIA PURIFICATION FOR SEMICONDUCTOR MANUFACTURE

[75] Inventors: Joe G. Hoffman, Cardiff; R. Scott Clark, Fallbrook, both of Calif.

[73] Assignee: Startec Ventures, Inc., Fallbrook, Calif.

[ * ] Notice: The term of this patent shall not extend beyond the expiration date of Pat. No. 5,496,778.

[21] Appl. No.: 674,110

[22] Filed: Jul. 1, 1996

Related U.S. Application Data

[63] Continuation-in-part of Ser. No. 610,261, Mar. 4, 1996, Pat. No. 5,755,934, which is a continuation of Ser. No. 179,001, Jan. 7, 1994, Pat. No. 5,496,778.
[51] Int. Cl.⁶ .............................. C01B 21/44; B01D 3/00
[52] U.S. Cl. .............................. 203/13; 203/40; 423/484; 423/488; 202/158; 202/161; 202/172; 202/200
[58] Field of Search .............................. 134/12; 423/484, 423/488; 202/158, 161, 172, 200; 159/47.1; 203/13, 12, 40

[56] References Cited

U.S. PATENT DOCUMENTS

| | | | |
|---|---|---|---|
| 4,828,660 | 5/1989 | Clark et al. | 204/82 |
| 4,929,435 | 5/1990 | Boghean et al. | 423/484 |
| 4,952,386 | 8/1990 | Davidson et al. | 423/484 |
| 4,980,032 | 12/1990 | Dobson | 203/40 |
| 5,164,049 | 11/1992 | Clark et al. | 203/40 |
| 5,242,468 | 9/1993 | Clark et al. | 29/25.01 |
| 5,288,333 | 2/1994 | Tanaka et al. | 134/31 |
| 5,346,557 | 9/1994 | Ito et al. | 134/10 |
| 5,496,778 | 3/1996 | Hoffman et al. | 437/250 |
| 5,500,098 | 3/1996 | Brown et al. | 203/13 |

FOREIGN PATENT DOCUMENTS 62-59522  3/1987  Japan .

*Primary Examiner*—Nina Bhat
*Attorney, Agent, or Firm*—Jeffrey L. Wendt

[57] ABSTRACT

Highly purified ammonia for use in semiconductor manufacturing is prepared on-site by drawing ammonia vapor from a liquid ammonia reservoir, passing the vapor through a filter capable of filtering out particles of less than 0.005 micron in size, and scrubbing the filtered vapor in a high-pH aqueous scrubber.

39 Claims, 6 Drawing Sheets

ON-SITE AMMONIA PURIFICATION FOR SEMICONDUCTOR MANUFACTURE

CROSS-REFERENCE TO RELATED APPLICATIONS

This application is a continuation-in-part of application Ser. No. 08/610,261, filed Mar. 4, 1996, now U.S. Pat No. 5,755,934 which is a continuation of application Ser. No. 08/179,001, filed Jan. 7, 1994, now U.S. Pat. No. 5,496,778. This application is also a continuation-in-part of PCT application Nos. PCT/US96/09570, filed Jun. 5, 1996, and PCT/US95/07649, filed Jun. 5, 1995. The present application also claims benefit of priority of U.S. Provisional Application Ser. No. 60/023,358, filed Jul. 7, 1995.

BACKGROUND AND SUMMARY OF THE INVENTION

The present invention relates to systems and methods for supplying ultra-high-purity ammonia for semiconductor manufacture.

Contamination in IC Manufacturing

Contamination is generally an overwhelmingly important concern in integrated circuit manufacturing. A large fraction of the steps in modern integrated circuit manufacturing are cleanup steps of one kind or another; such cleanup steps may need to remove organic contaminants, metallic contaminants, photoresist (or inorganic residues thereof), byproducts of etching, native oxides, etc.

As of 1995 the cost of a new front end (integrated circuit wafer fabrication facility) is typically more than a billion dollars ($1,000,000,000), and a large fraction of this cost is directed to measures for particulate control, cleanup, and contamination control.

One important source of contamination is impurities in the process chemicals. Since the cleanups are so frequent and so critical, contamination due to cleanup chemistry is very undesirable.

Ammonia Purification

Ammonia ($NH_3$) is an important process chemical in semiconductor manufacturing. It is very commonly used for deposition of silicon nitride, and may also be used for nitridation or for deposition of other nitrides. Ammonia (in the form of ammonium hydroxide) is also widely used in the basic cleanup portion of the standard RCA cleanup. (The RCA cleanup includes: 1) solvent wash to remove gross organics—in tetrachloroethylene or comparable solvent; 2) basic cleanup—$NH_4OH+H_2O_2+H_2O$ in proportions of 1:1:5 or 1:2:7; and 3) acid cleanup—$HCl+H_2O_2+H_2O$ in proportions of 1:1:6 or 1:2:8.) See W. Runyan and K. Bean, SEMICONDUCTOR INTEGRATED CIRCUIT PROCESSING TECHNOLOGY (1990), which is hereby incorporated by reference. For semiconductor manufacturing, such cleanup reagents are normally bought as packaged containers. However, this implies that some handling of the solutions in those containers will be necessary, both at the manufacturer's plant and at the use location. Such handling of ultra-high purity chemicals is always undesirable.

Ammonia presents particular difficulties, since liquid ammonia contains both solid and volatile impurities, many of which are damaging to electronic components if present during the manufacturing process. The impurities level and content may vary widely depending on the source as well as the handling method, and all such impurities must be removed before the ammonia can be used in electronic component production lines.

To meet this standard, production facilities have had to obtain high-quality ammonia at considerable cost from the limited sources which are able to supply ammonia at an acceptable grade. Only qualified suppliers can be used, and new suppliers must be qualified before their product can be accepted. This cost and the lack of flexibility add considerably to the cost of the components.

A further constraint is presented by Department of Transportation regulations, under which aqueous ammonia must be shipped at ammonia concentrations no higher than 30%.

Clearly there is a need for a reliable means of supplying ammonia at a purity level which will produce a high yield of acceptable product in ultra-high precision components, and which can meet the requirements of advancing electronics technology.

Ammonia Purification

It has now been discovered that ammonia can be supplied to a production line for high-precision electronic devices in ultra-high purity form by use of an on-site system which draws ammonia vapor from a liquid ammonia reservoir, passes the ammonia vapor through a microfiltration filter, and scrubs the filtered vapor with high-pH purified water. The uniqueness of this discovery is that it can convert commercial grade ammonia to ammonia of sufficiently high purity for high-precision manufacturing without the need for conventional column distillation. The drawing of the ammonia vapor from the supply reservoir serves by itself as a single-stage distillation, eliminating nonvolatile and high-boiling impurities, such as alkali and alkaline earth metal oxides, carbonates and hydrides, transition metal halides and hydrides, and high-boiling hydrocarbons and halocarbons. The reactive volatile impurities that could be found in commercial grade ammonia, such as certain transition metal halides, Group III metal hydrides and halides, certain Group IV hydrides and halides, and halogens, previously thought to require distillation for removal, are now discovered to be capable of removal by scrubbing to a degree which is adequate for high-precision operations. This is a highly unusual discovery, since scrubber technology is traditionally used for the removal of macro-scale, rather than micro-scale, impurities. In the present invention, the scrubber lowers the levels of impurities which are damaging to semiconductor wafer manufacture to less than 1 ppb per element or less than 30 ppb total. For operations where even greater purity is desired, distillation may also be performed subsequent to the scrubbing. An advantage of the invention, however, is that if distillation is included, the scrubber considerably lessens the burden on, and design requirements for, the distillation column, enhancing the product purity even further. The removal of impurities which are close-boiling relative to ammonia, such as reactive hydrides, fluorides, and chlorides, simplifies the distillation column design considerably.

On-Site Preparation of Ultrapure Mixed Cleanup Solutions

The present application discloses preparation of mixed cleanup solutions, such as the RCA acidic cleanup and the RCA basic cleanup, at the site of a wafer fabrication facility, from ingredients which themselves have been ultrapurified at the same site.

The RCA cleanup includes: 1) solvent wash to remove gross organics—in tetrachloroethylene or comparable solvent; 2) basic cleanup—$NH_4OH+H_2O_2+H_2O$; and 3) acid cleanup—$HCl+H_2O_2+H_2O$.) See W. Runyan and K. Bean, SEMICONDUCTOR INTEGRATED CIRCUIT PROCESSING TECHNOLOGY (1990), which is hereby incorporated by reference.

The RCA basic cleanup solution is typically $NH_4OH+H_2O_2+H_2O$ in proportions of 1:1:5 or 1:2:7. According to one of the innovative teachings disclosed herein, RCA basic cleanup (or analogous cleanup solutions) is generated at the site of a wafer manufacturing plant, by combination of ultra-pure ammonia which has been purified on-site with ultra-pure hydrogen peroxide which has been purified on-site. Thus purity is increased, and the risk of undetected accidental contamination is reduced.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
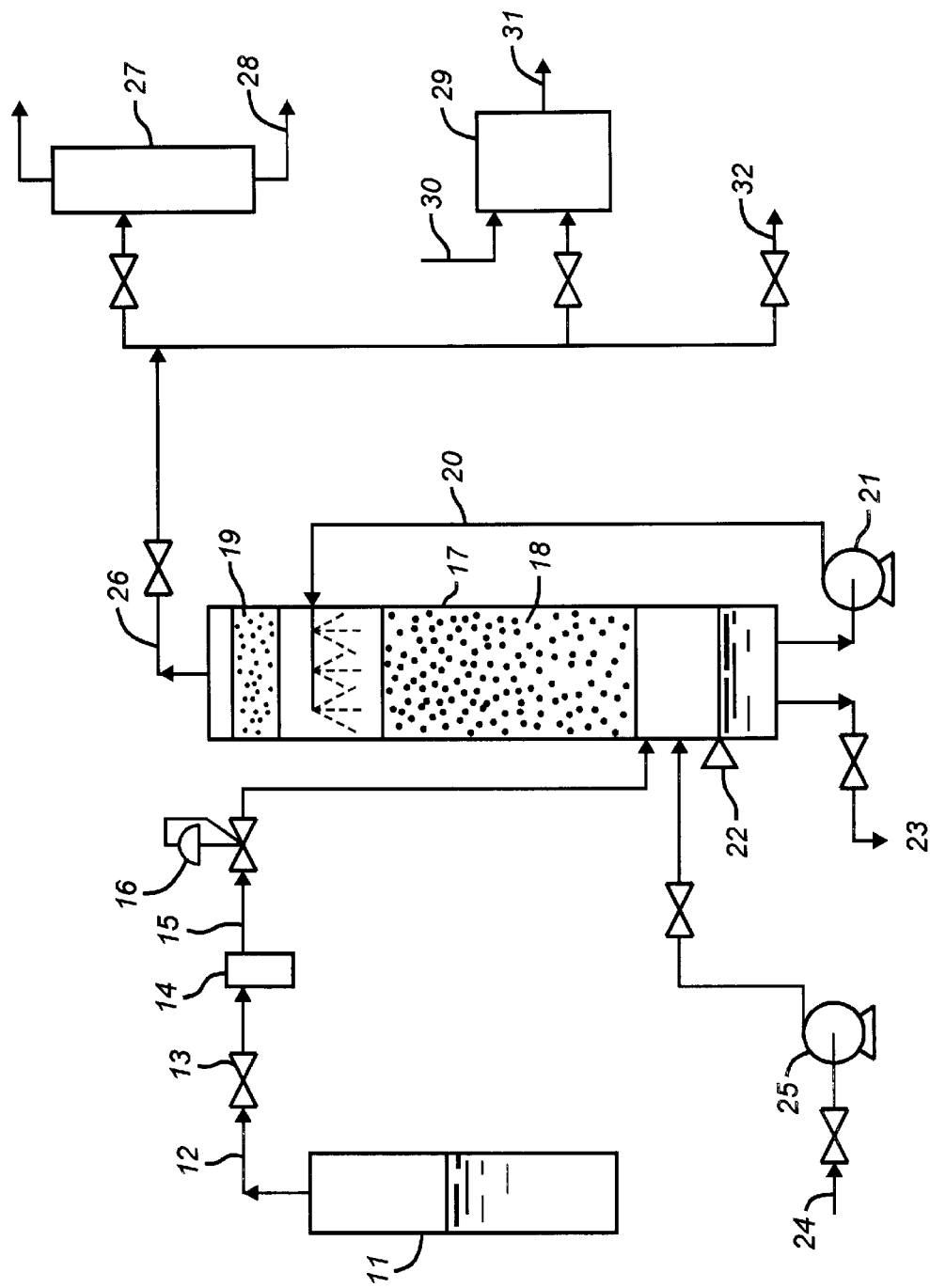
FIG. 1 is an engineering flow diagram of one example of a unit for the production of ultrapure ammonia.

The numerous innovative teachings of the present application will be described with particular reference to the presently preferred embodiment (by way of example, and not of limitation), in which:

Purification of $NH_3$

In accordance with this invention, ammonia vapor is first drawn from the vapor space in a liquid ammonia supply reservoir. Drawing vapor in this manner serves as a single-stage distillation, leaving certain solid and high-boiling impurities behind in the liquid phase. The supply reservoir can be any conventional supply tank or other reservoir suitable for containing ammonia, and the ammonia can be in anhydrous form or an aqueous solution. The reservoir can be maintained at atmospheric pressure or at a pressure above atmospheric if desired to enhance the flow of the ammonia through the system. The reservoir is preferably heat controlled, so that the temperature is within the range of from about 10° to about 50° C., preferably from about 15° to about 35° C., and most preferably from about 200° to about 25° C.

Impurities that will be removed as a result of drawing the ammonia from the vapor phase include metals of Groups I and II of the Periodic Table, as well as aminated forms of these metals which form as a result of the contact with ammonia. Also rejected will be oxides and carbonates of these metals, as well as hydrides such as beryllium hydride and magnesium hydride; Group III elements and their oxides, as well as ammonium adducts of hydrides and halides of these elements; transition metal hydrides; and heavy hydrocarbons and halocarbons such as pump oil.

The ammonia drawn from the reservoir is passed through a filtration unit to remove any solid matter entrained with the vapor. Microfiltration and ultrafiltration units and membranes are commercially available and can be used. The grade and type of filter will be selected according to need. The presently preferred embodiment uses a gross filter, followed by a 0.1 micron filter, in front of the ionic purifier, and no filtration after the ionic purifier.

The filtered vapor is then passed to a scrubber in which the vapor is scrubbed with high-pH purified (preferably deionized) water. The high-pH water is preferably an aqueous ammonia solution, with the concentration raised to saturation by recycling through the scrubber. The scrubber may be conveniently operated as a conventional scrubbing column in countercurrent fashion. Although the operating temperature is not critical, the column is preferably run at a temperature ranging from about 10° to about 50° C., preferably from about 15° to about 35° C. Likewise, the operating pressure is not critical, although preferred operation will be at a pressure of from about atmospheric pressure to about 30 psi above atmospheric. The column will typically contain a conventional column packing to provide for a high degree of contact between liquid and gas, and preferably a mist removal section as well.

In one presently preferred example, the column has a packed height of approximately 3 feet (0.9 meter) and an internal diameter of approximately 7 inches (18 cm), to achieve a packing volume of 0.84 cubic feet (24 liters), and is operated at a pressure drop of about 0.3 inches of water (0.075 kPa) and less than 10% flood, with a recirculation flow of about 2.5 gallons per minute (0.16 liter per second) nominal or 5 gallons per minute (0.32 liter per second) at 20% flood, with the gas inlet below the packing, and the liquid inlet above the packing but below the mist removal section. Preferred packing materials for a column of this description are those which have a nominal dimension of less than one-eighth of the column diameter. The mist removal section of the column will have a similar or more dense packing, and is otherwise conventional in construction. It should be understood that all descriptions and dimensions in this paragraph are examples only. Each of the system parameters may be varied.

In typical operation, startup is achieved by first saturating deionized water with ammonia to form a solution for use as the starting scrubbing medium. During operation of the scrubber, a small amount of liquid in the column sump is drained periodically to remove accumulated impurities.

Examples of impurities that will be removed by the scrubber include reactive volatiles such as silane ($SiH_4$) and arsine ($AsH_3$); halides and hydrides of phosphorus, arsenic, and antimony; transition metal halides in general; and Group III and Group VI metal halides and hydrides.

The units described up to this point may be operated in either batchwise, continuous, or semi-continuous manner. Continuous or semi-continuous operation is preferred. The volumetric processing rate of the ammonia purification system is not critical and may vary widely. In most operations for which the present invention is contemplated for use, however, the flow rate of ammonia through the system will be within the range of about 200 cc/h to thousands of liters per hour.

Optionally the ammonia leaving the scrubber can be further purified prior to use, depending on the particular type of manufacturing process for which the ammonia is being purified. When the ammonia is intended for use in chemical vapor deposition, for example, the inclusion of a dehydration unit and a distillation unit in the system will be beneficial. The distillation column may also be operated in either batchwise, continuous, or semi-continuous manner. In a batch operation, a typical operating pressure might be 300 pounds per square inch absolute (2,068 kPa), with a batch size of 100 pounds (45.4 kg). The column in this example has a diameter of 8 inches (20 cm), a height of 72 inches (183 cm), operating at 30% of flood, with a vapor velocity of 0.00221 feet per second (0.00067 meter per second), a height equivalent to a theoretical plate of 1.5 inches (3.8 cm), and 48 equivalent plates. The boiler size in this example is about 18 inches (45.7 cm) in diameter and 27 inches (68.6 cm) in length, with a reflux ratio of 0.5, and recirculating chilled water enters at 60° F. (15.6°C.) and leaves at 90° F. (32.2° C.). Again, this is merely an example; distillation columns varying widely in construction and operational parameters can be used.

Depending on its use, the purified ammonia, either with or without the distillation step, may be used as a purified gas or as an aqueous solution, in which case the purified ammonia is dissolved in purified (preferably deionized) water. The proportions and the means of mixing are conventional.

A flow chart depicting one example of an ammonia purification unit in accordance with this invention is shown in FIG. 1. Liquid ammonia is stored in a reservoir 11. Ammonia vapor 12 is drawn from the vapor space in the reservoir, then passed through a shutoff valve 13, then through a filter 14. The filtered ammonia vapor 15, whose flow is controlled by a pressure regulator 16, is then directed to a scrubbing column 17 which contains a packed section 18 and a mist removal pad 19. Saturated aqueous ammonia 20 flows downward as the ammonia vapor flows upward, the liquid being circulated by a circulation pump 21, and the liquid level controlled by a level sensor 22. Waste 23 is drawn off periodically from the retained liquid in the bottom of the scrubber. Deionized water 24 is supplied to the scrubber 17, with elevated pressure maintained by a pump 25. The scrubbed ammonia 26 is directed to one of three alternate routes. These are:

(1) A distillation column 27 where the ammonia is purified further. The resulting distilled ammonia 28 is then directed to the point of use.

(2) A dissolving unit 29 where the ammonia is combined with deionized water 30 to form an aqueous solution 31, which is directed to the point of use. For plant operations with multiple points of use, the aqueous solution can be collected in a holding tank from which the ammonia is drawn into individual lines for a multitude of point-of-use destinations at the same plant.

(3) A transfer line 32 which carries the ammonia in gaseous form to the point of use. The second and third of these alternatives, which do not utilize the distillation column 27 are suitable for producing ammonia with less than 100 parts per trillion of any metallic impurity. For certain uses, however, the inclusion of the distillation column 27 is preferred. Examples are furnace or chemical vapor deposition (CVD) uses of the ammonia. If the ammonia is used for CVD, for example, the distillation column would remove non-condensables such as oxygen and nitrogen, that might interfere with CVD. In addition, since the ammonia leaving the scrubber 17 is saturated with water, a dehydration unit may be incorporated into the system between the scrubber 17 and the distillation column 27, as an option, depending on the characteristics and efficiency of the distillation column.

With any of these alternatives, the resulting stream, be it gaseous ammonia or an aqueous solution, may be divided into two or more branch streams, each directed to a different use station, the purification unit thereby supplying purified ammonia to a number of use stations simultaneously.

Generation of Aqueous Ammonia

The ultrapure gaseous ammonia produced by the apparatus of FIG. 1 is preferably converted into aqueous ammonia for use in wafer cleaning. FIG. 3A shows the process flow of the generation system of the presently preferred embodiment.

Figure 3:
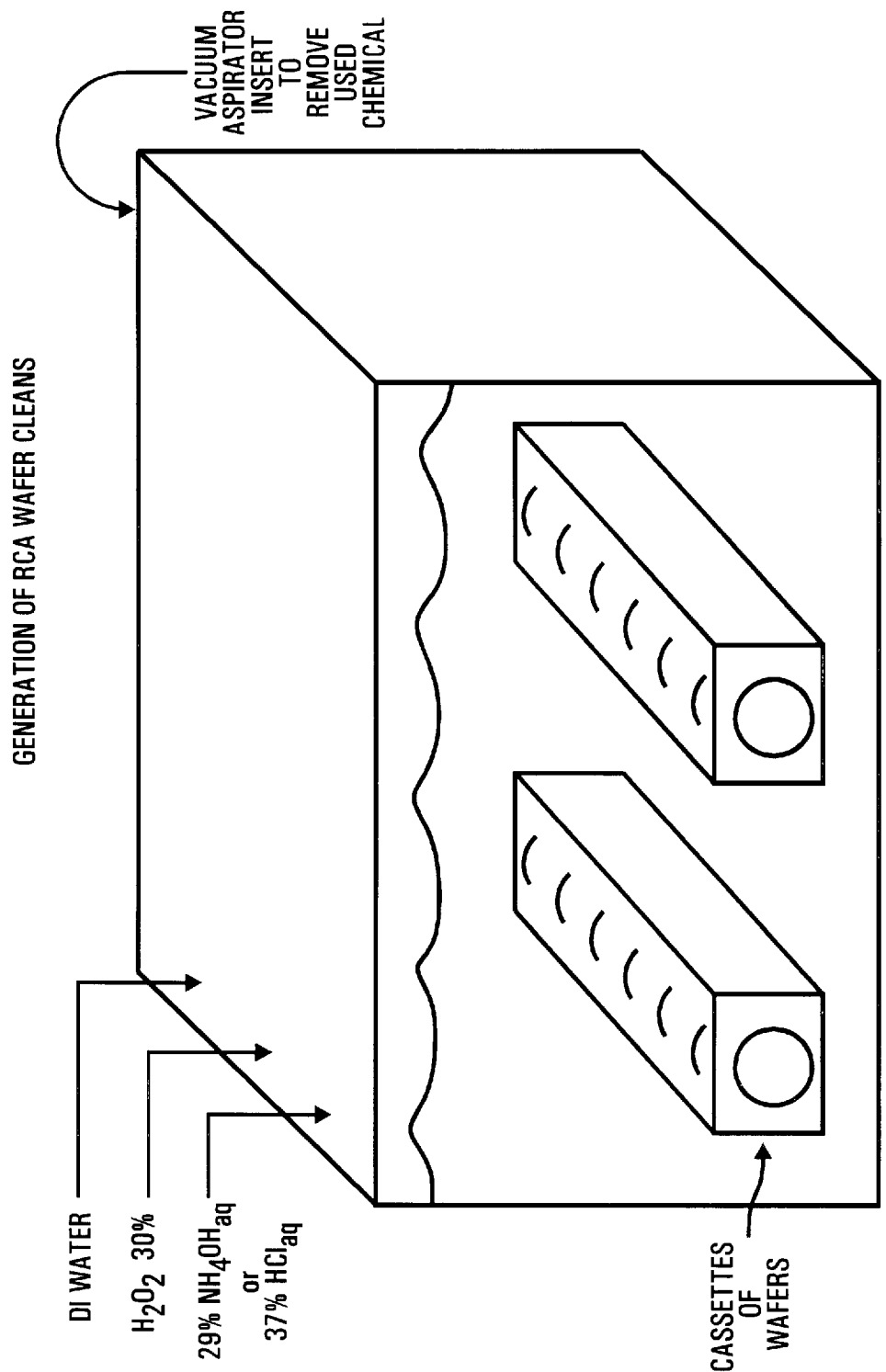
FIG. 3 shows generation of an RCA cleanup solution on-site, at a wafer fabrication facility, using two components (in addition to ultrapure water) which have both been ultrapurified on-site at the same facility.
Figure 3A:
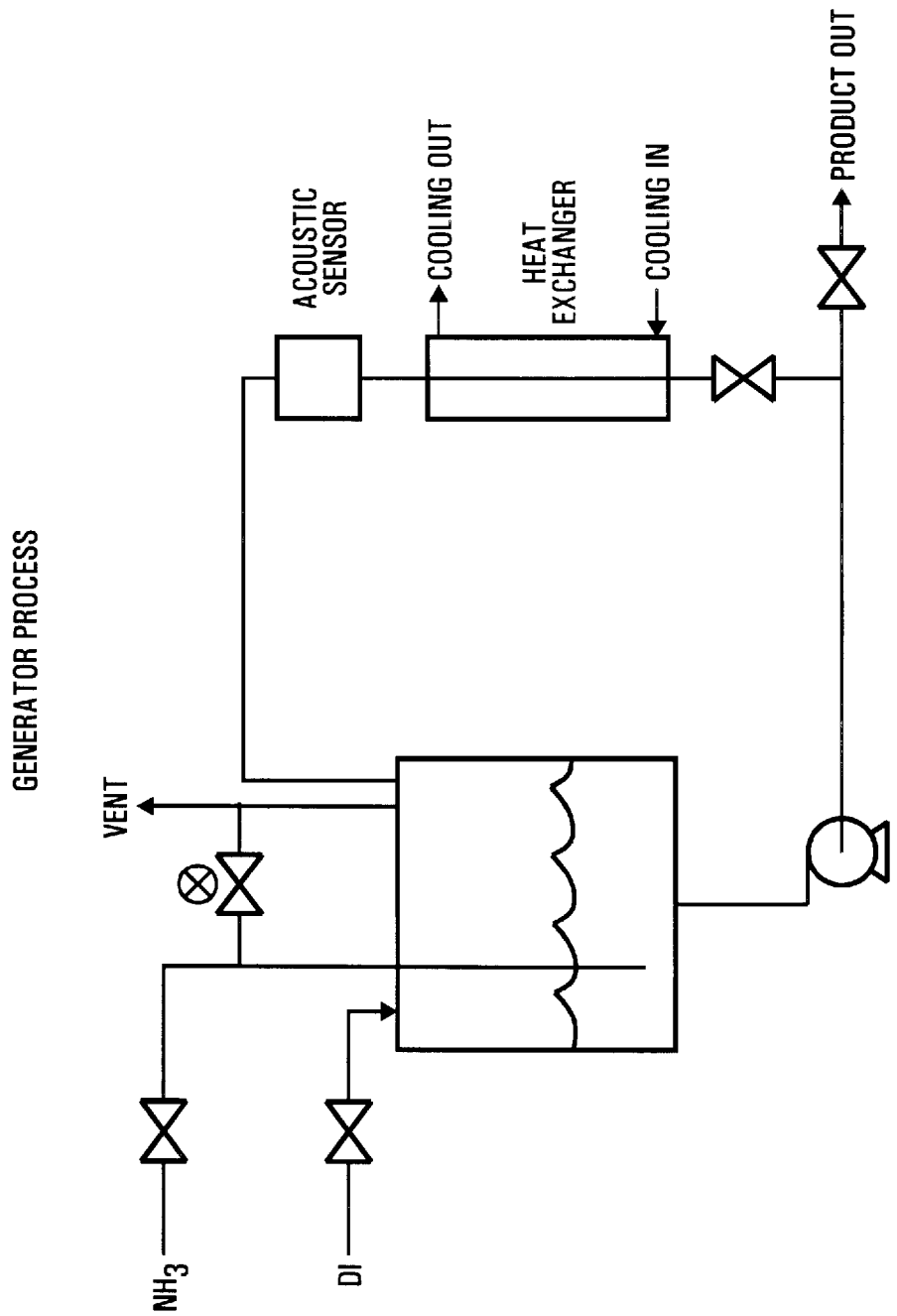
FIG. 3A shows the process flow of the generation system of the presently preferred embodiment.
Figure 3B:
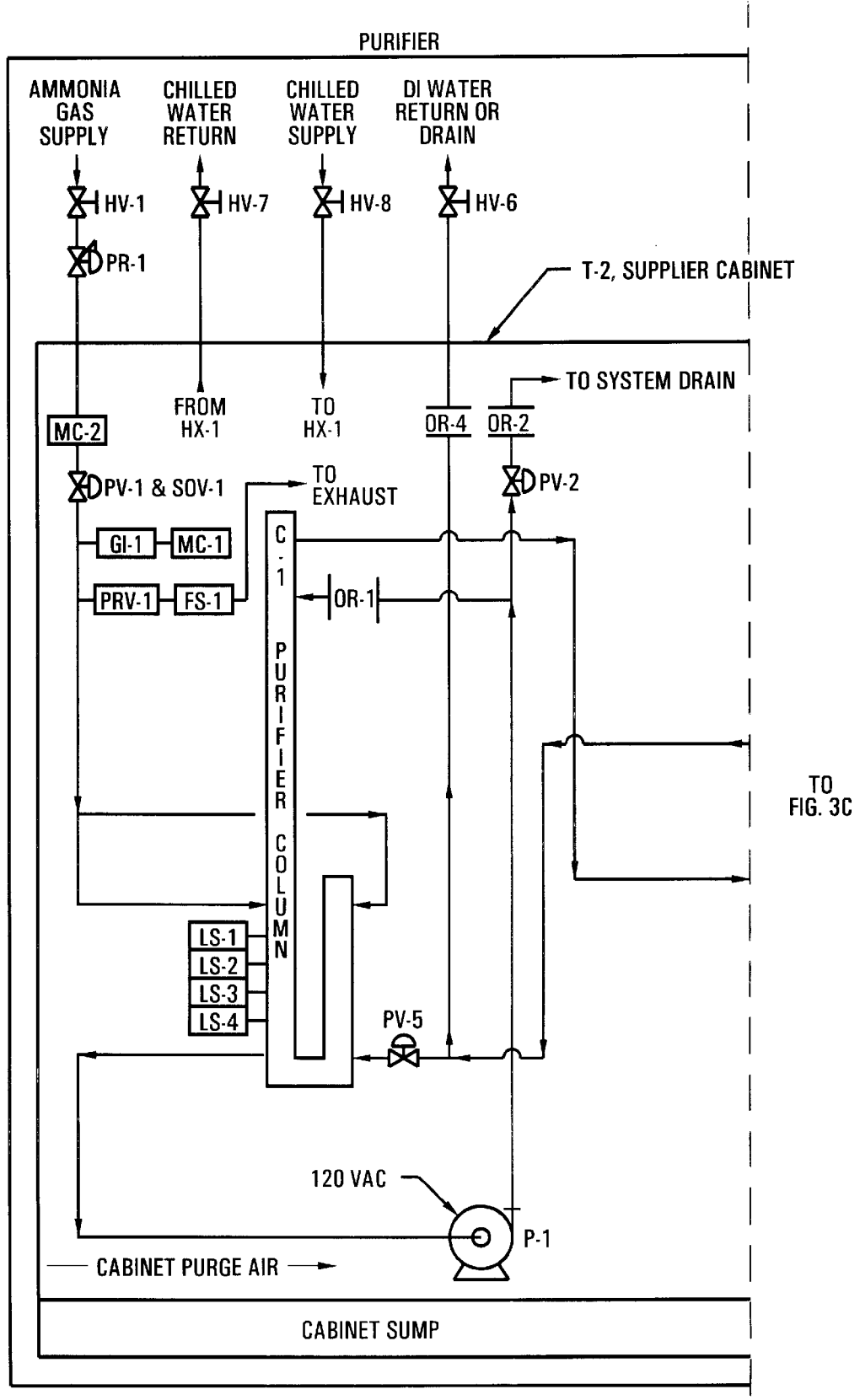
FIGS. 3B and 3C are parts of a single large figure which shows a integrated purification and generation system.
Figure 3C:
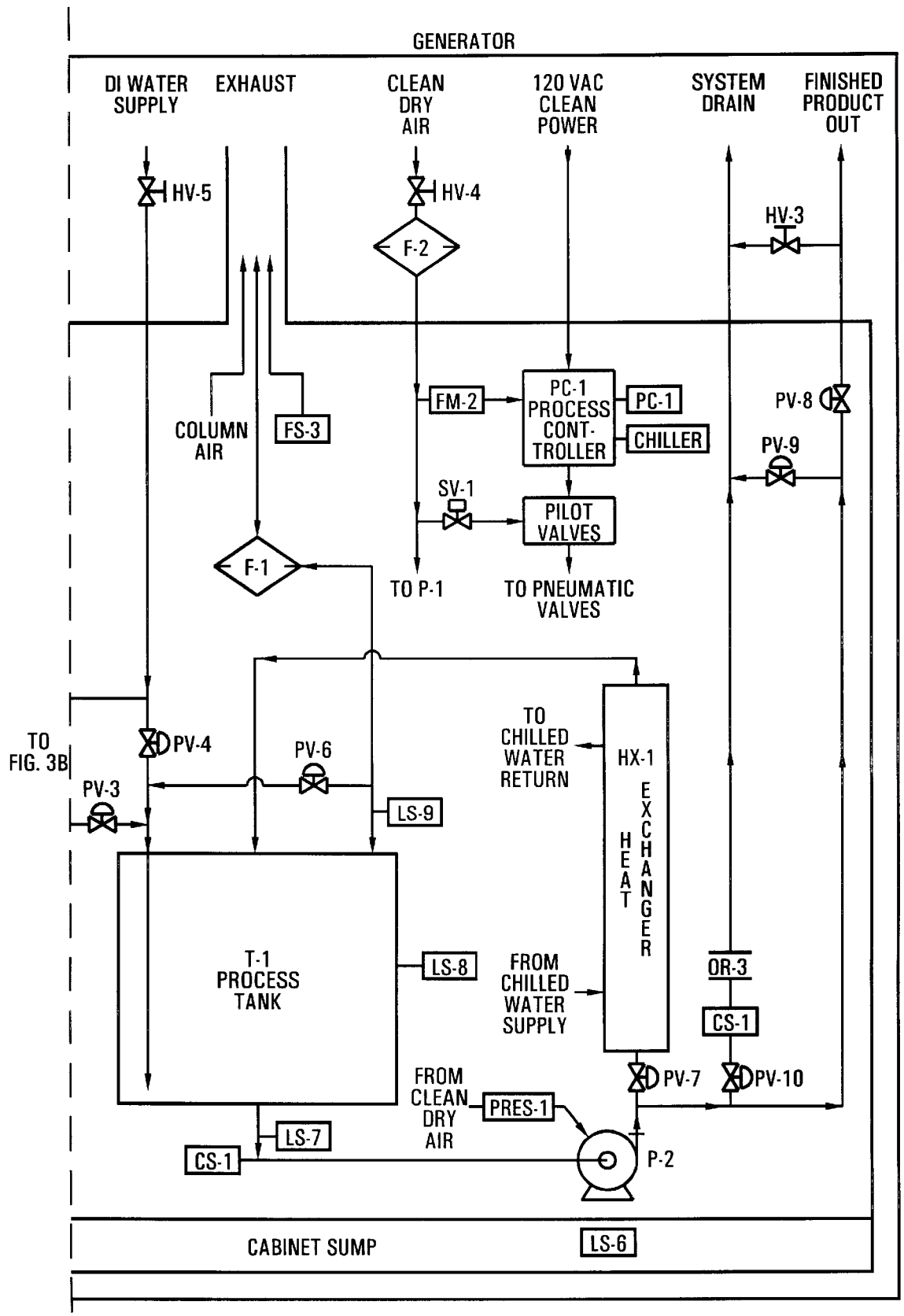

FIGS. 3B and 3C are parts of a single large figure which shows an integrated purification and generation system. This figure is a P&ID diagram, which shows great detail of the presently preferred embodiment which has been proven to produce contaminant levels to far below 100 ppt.

Generation of Mixed Cleanup Solutions

FIG. 3 shows generation of an RCA cleanup solution on-site, at a wafer fabrication facility, using two components (in addition to ultrapure water) which have both been ultrapurified on-site at the same facility. In this example, the cleanup solution is RCA basic solution, and the components are $NH_4OH$ and $H_2O_2$.

Wafer Cleaning

Figure 2:
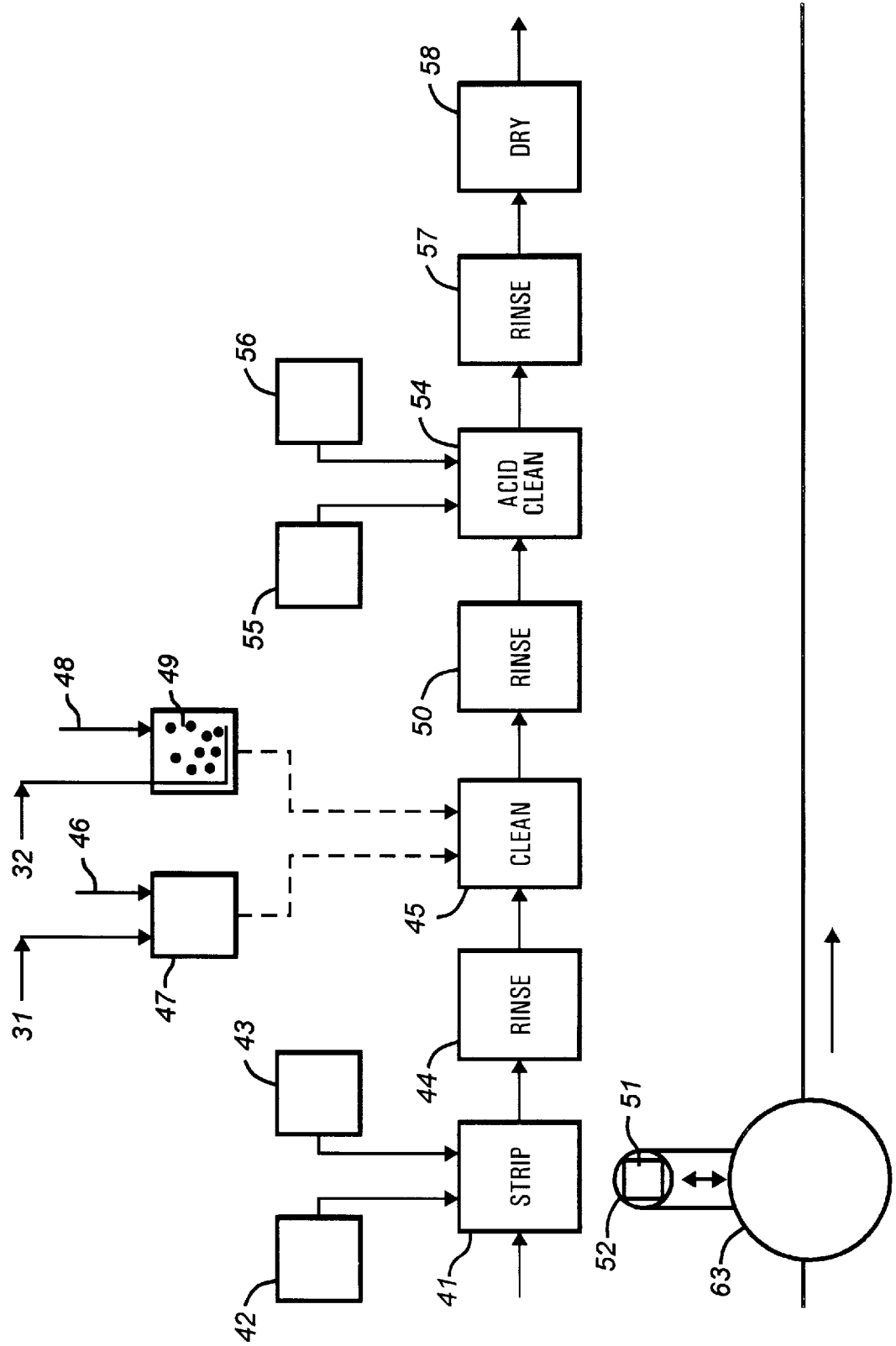
FIG. 2 is a block diagram of semiconductor cleanup stations, in a wafer fabrication facility in which the ammonia purification of FIG. 1 may be incorporated.

Some cleanup stations in a conventional line for semiconductor fabrication are depicted in FIG. 2. The first unit in the cleaning line is a resist stripping station 41 where aqueous hydrogen peroxide 42 and sulfuric acid 43 are combined and applied to the semiconductor surface to strip off the resist. This is succeeded by a rinse station 44 where deionized water is applied to rinse off the stripping solution. Immediately downstream of the rinse station 44 is a cleaning station 45 where an aqueous solution of ammonia and hydrogen peroxide are applied. This solution is supplied in one of two ways. In the first, aqueous ammonia 31 from the dissolving unit 29 shown in FIG. 1 is combined with aqueous hydrogen peroxide 46, and the resulting mixture 47 is directed to the cleaning station 45. In the second, pure gaseous ammonia 32 from the like-numbered line in FIG. 1 is bubbled into an aqueous hydrogen peroxide solution 48 to produce a similar mixture 49, which is likewise directed to the cleaning station 45. Once cleaned with the ammonia/ hydrogen peroxide combination, the semiconductor passes to a second rinse station 50 where deionized water is applied to remove the cleaning solution. The next station is a further cleaning station 54 where aqueous solutions of hydrochloric acid 55 and hydrogen peroxide 56 are combined and applied to the semiconductor surface for further cleaning. This is followed by a final rinse station 57 where deionized water is applied to remove the HCl and $H_2O_2$, and finally a drying station 58. The wafer or wafer batch 51 will be held on a wafer support 52, and conveyed from one workstation to the next by a robot 63 or some other conventional means of achieving sequential treatment. The means of conveyance may be totally automated, partially automated or not automated at all. Note that purified HCl for the acid cleaning station 54 may be prepared and supplied on site in a manner similar to that of the ammonia purification system of FIG. 1.

The system shown in FIG. 2 is just one example of a cleaning line for semiconductor fabrication. In general, cleaning lines for high-precision manufacture can vary widely from that shown in FIG. 2, either eliminating one or more of the units shown or adding or substituting units not shown. The concept of the on-site preparation of high-purity aqueous ammonia, however, in accordance with this invention is applicable to all such systems.

The use of ammonia and hydrogen peroxide as a semiconductor cleaning medium at workstations such as the cleaning station 45 shown in FIG. 2 is well known throughout the industry. While the proportions vary, a nominal system would consist of deionized water, 29% ammonium hydroxide (weight basis) and 30% hydrogen peroxide (weight basis), combined in a volume ratio of 6:1:1. This cleaning agent is used to remove organic residues, and, in conjunction with ultrasonic agitation at frequencies of approximately 1 MHz, removes particles down to the submicron size range.

In one class of embodiments, the purification (or purification and generation) system is positioned in close proximity to the point of use of the ammonia in the production line, leaving only a short distance of travel between the purification unit and the production line. Alternatively, for plants with multiple points of use for purified ammonia, the ammonia from the purification (or purification and generation) unit may pass through an intermediate holding tank before reaching the points of use. Each point of use will then be fed by an individual outlet line from the holding tank. In either case, the ammonia can therefore be directly applied to the semiconductor substrate without packaging or transport and without storage other than a small in-line reservoir, and thus without contact with the potential sources of contamination normally encountered when chemicals are manufactured and prepared for use at locations external to the manufacturing facility. In this class of embodiments, the distance between the point at which the ammonia leaves the purification system and its point of use on the production line will generally be a few meters or less. This distance will be greater when the purification system is a central plant-wide system for piping to two or more use stations, in which case the distance may be two thousand feet or greater. Transfer can be achieved through an ultra-clean transfer line of a material which does not introduce contamination. In most applications, stainless steel or polymers such as high density polyethylene or fluorinated polymers can be used successfully.

Due to the proximity of the ammonia purification unit to the production line, the water used in the unit can be purified in accordance with semiconductor manufacturing standards. These standards are commonly used in the semiconductor industry and well known among those skilled in the art and experienced in the industry practices and standards. Methods of purifying water in accordance with these standards include ion exchange and reverse osmosis. Ion exchange methods typically include most or all of the following units: chemical treatment such as chlorination to kill organisms; sand filtration for particle removal; activated charcoal filtration to remove chlorine and traces of organic matter: diatomaceous earth filtration; anion exchange to remove strongly ionized acids; mixed bed polishing, containing both cation and anion exchange resins to remove further ions; sterilization, involving chlorination or ultraviolet light: and filtration through a filter of 0.45 micron or less. Reverse osmosis methods will involve, in place of one or more of the units in the ion exchange process, the passage of the water under pressure through a selectively permeable membrane which does not pass many of the dissolved or suspended substances. Typical standards for the purity of the water resulting from these processes are a resistivity of at least about 15 megohm-cm at 25° C. (typically 18 megohm-cm at 25° C.), less than about 25 ppb of electrolytes, a particulate content of less than about $150/cm^3$ and a particle size of less than 0.2 micron, a microorganism content of less than about $10/cm^3$, and total organic carbon of less than 100 ppb.

In the process and system of this invention, a high degree of control over the product concentration and hence the flow rates is achieved by precise monitoring and metering using known equipment and instrumentation. A convenient means of achieving this for ammonia is by vapor pressure measurement. Other methods will be readily apparent to those skilled in the art.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

For example, a less preferred alternative is to use an aqueous ammonia supply (with heating) to provide an $NH_3$ source. This has the disadvantage that ammonia saturates at a relatively low concentration (e.g 30%), and hence is a relatively weak source of gaseous ammonia; but this is a possible modification of the disclosed innovative concepts, and, while less economically attractive, would retain at least some of the advantages of the disclosed innovations.

For example, the disclosed innovative techniques are not strictly limited to manufacture of integrated circuits, but can also be applied to manufacturing discrete semiconductor components, such as optoelectronic and power devices.

For another example, the disclosed innovative techniques can also be adapted to manufacture of other technologies where integrated circuit manufacturing methods have been adopted, such as in thin-film magnetic heads and active-matrix liquid-crystal displays; but the primary application is in integrated circuit manufacturing, and applications of the disclosed techniques to other areas are secondary.

For another example, it is not strictly necessary to use a scrubber to perform the liquid-vapor contact; a bubbler could be used instead, although this is much less desirable because of the less efficient gas/liquid contact.

Optionally other filtration or filtration stages can be combined with the disclosed purification apparatus.

It should also be noted that additives can be introduced into the purification water if desired, although this is not done in the presently preferred embodiment.

As noted above, the primary embodiment is an on-site purification system. Alternatively, in a less preferred class of embodiment, the disclosed purification system can also be adapted to operate as a part of a manufacturing unit to produce ultra-high-purity chemicals for shipment; however, this alternative embodiment does not provide the advantages of on-site purification as discussed above. Such applications encounter the inherent risks of handling ultra-high-purity chemicals, as discussed above; but for customers who require packaged chemicals (with the attendant handling), the disclosed innovations at least give a way to achieve an initial purity which is higher than that available by other techniques. Again, in such applications a dryer stage may also be used after the ionic purifier.

As noted above, the primary embodiment is directed to providing ultrapure aqueous chemicals, which are most critical for semiconductor manufacturing. However, the disclosed system and method embodiments can also be used for supply of purified gas streams. (In many cases, use of a dryer downstream from the purifier will be useful for this.)

It should also be noted that piping for ultrapure chemical routing in semiconductor front ends may include in-line or pressure reservoirs. Thus references to "direct" piping in the claims do not preclude use of such reservoirs, but do preclude exposure to uncontrolled atmospheres.

The disclosed inventions are also useful for preparation of various other cleanup chemistries used in IC manufacturing. For example, the Shiraki cleanup is an aggressive, pre-epitaxy cleanup, which adds a nitric acid step to the cleanup sequence, and uses somewhat higher temperatures and concentrations. See Ishizaki and Shiraki, "Low Temperature Surface Cleaning of Silicon and its application to Silicon MBE," 133 J. ELECTROCHEM. Soc. 666 (1986), which is hereby incorporated by reference.

What is claimed is:

1. An on-site subsystem, in a semiconductor device fabrication facility, for providing ultra-high-purity reagents comprising ammonia to a semiconductor manufacturing operation, comprising:

an evaporation source connected to receive a liquid ammonia source and to provide a flow of ammonia vapor therefrom;

said flow of ammonia vapor being connected to pass through an ionic purifier unit which provides a recirculating volume of high-purity water, containing a high concentration of ammonium hydroxide, in contact with said flow of ammonia vapor;

a generator unit, connected to receive said flow of ammonia vapor from said purifier unit and to combine said ammonia vapor with an aqueous liquid to produce an ultra-pure aqueous solution comprising ammonia; and a piping connection which routes said aqueous solution to at least one point of use in the semiconductor device fabrication facility.

2. The system of claim 1, further comprising a particulate filter interposed between said evaporation source and said purifier unit.

3. The system of claim 1, wherein said liquid ammonia source consists of anhydrous ammonia.

4. The system of claim 1, wherein said recirculating volume of high-purity water does not contain any additives.

5. The system of claim 1, wherein said liquid ammonia source is of standard commercial-grade purity.

6. The system of claim 1, wherein said evaporator is a bulk storage tank.

7. The system of claim 1, wherein said evaporator operates at a controlled temperature, and is connected to receive liquid ammonia from a bulk storage tank.

8. An on-site subsystem, in a semiconductor device fabrication facility, for providing ultra-high-purity reagents comprising ammonia to a semiconductor manufacturing operation, comprising:

an evaporation source connected to receive a liquid ammonia source and to provide a flow of ammonia vapor therefrom;

said flow of ammonia vapor being connected to pass through an ionic purifier unit which provides a recirculating volume of high-purity water, containing a high concentration of ammonium hydroxide, in contact with said flow of ammonia vapor; and a generator unit, connected to receive said flow of ammonia vapor from said purifier unit and to combine said ammonia vapor with an aqueous liquid to produce an ultra-pure aqueous solution comprising ammonia;

whereby said ultra-pure aqueous solution can be used within the semiconductor device fabrication facility without bulk transfer or exposure of liquid surface to any uncontrolled atmosphere.

9. The system of claim 8, further comprising a particulate filter interposed between said evaporation source and said purifier unit.

10. The system of claim 8, wherein said liquid ammonia source consists of anhydrous ammonia.

11. The system of claim 8, wherein said recirculating volume of high-purity water does not contain any additives.

12. The system of claim 8, wherein said liquid ammonia source is of standard commercial-grade purity.

13. The system of claim 8, wherein said evaporator is a bulk storage tank.

14. The system of claim 8, wherein said evaporator operates at a controlled temperature, and is connected to receive liquid ammonia from a bulk storage tank.

15. An on-site subsystem, in a semiconductor device fabrication facility, for providing ultra-high-purity ammonia for use in semiconductor manufacturing operations at said facility, comprising:

an evaporation source connected to receive a liquid ammonia source and to provide a flow of ammonia vapor therefrom;

said flow of ammonia vapor being connected to pass through an ionic purifier unit which provides a recirculating volume of high-purity water, containing a high concentration of ammonium hydroxide, in contact with said flow of ammonia vapor;

a dryer unit, connected to receive said flow of ammonia vapor from said purifier unit and to dry said vapor from said purifier unit; and a piping connection which routes said vapor from said dryer unit to at least one point of use in the semiconductor device fabrication facility.

16. The system of claim 15, further comprising a particulate filter interposed between said evaporation source and said purifier unit.

17. The system of claim 15, wherein said liquid ammonia source consists of anhydrous ammonia.

18. The system of claim 15, wherein said recirculating volume of high-purity water does not contain any additives.

19. The system of claim 15, wherein said liquid ammonia source is of standard commercial-grade purity.

20. The system of claim 15, wherein said evaporator is a bulk storage tank.

21. The system of claim 15, wherein said evaporator operates at a controlled temperature, and is connected to receive liquid ammonia from a bulk storage tank.

22. A system for the preparation of ultra-high purity ammonia, said system comprising:

(a) a reservoir of liquid ammonia with a vapor space above said liquid;

(b) a connection for drawing vapor containing ammonia gas from said vapor space;

(c) a filtration membrane adapted to remove particles from vapor thus drawn;

(d) an ionic purifier unit in which filtered vapor emanating from said filtration membrane is contacted with an aqueous solution of ammonia in deionized water to produce a purified ammonia gas; and (e) an outlet for removing said purified ammonia gas from said ionic purifier unit.

23. A system in accordance with claim 22, further comprising a distillation column arranged to distill the purified ammonia gas emerging from said ionic purifier unit.

24. A system for the manufacture of high-precision electronic components, said system comprising:

(a) a production line containing a plurality of workstations arranged to perform various respective steps, on wafers containing semiconductor material, in manufacture of an electronic component, at least one of said workstations using gaseous ammonia as a source gas for operation on to said workpiece; and (b) a purification subunit connected to said at least one of said workstations by piping to supply said gaseous ammonia in ultra-high purity form, said subunit comprising:

(i) a reservoir of liquid ammonia with a vapor space above said liquid ammonia;

(ii) a connection for drawing vapor containing ammonia gas from said vapor space;

(iii) a filtration membrane for removing particles from vapor thus drawn; and (iv) an ionic purifier unit arranged to contact filtered vapor having passed through said filtration membrane with an aqueous solution of ammonia in deionized water, the vapor emerging from said ionic purifier unit being purified ammonia gas.

25. A system in accordance with claim 24 in which said subunit further comprises a distillation column arranged to distill vapor emerging from said ionic purifier unit.

26. A system in accordance with claim 24 in which said subunit further comprises means for combining said purified ammonia gas with purified water to form an aqueous ammonia solution.

27. A system in accordance with claim 24 in which ammonia purified by said subunit leaves said subunit at a location positioned within approximately 30 cm of said means for applying the ammonia of step (c) directly to said workpiece.

28. A system in accordance with claim 24 in which said subunit is sized to produce said purified ammonia gas at a rate of from about 2 l/h to about 200 l/h.

29. A system in accordance with claim 24 in which components (ii), (iii), and (iv) of said subunit are arranged for continuous or semi-continuous flow.

30. A method for supplying a high-purity ammonia reagent to a workstation in a production line for the manufacture of a high-precision electronic component, said method comprising:
(a) drawing ammonia gas from a vapor space above liquid ammonia in an ammonia-containing reservoir;
(b) passing said ammonia gas through a filtration membrane to remove particles greater than 0.005 micron therefrom;
(c) passing said ammonia gas thus filtered through an ionic purifier unit whereby said ammonia gas is contacted with an aqueous solution of ammonia in deionized water; and
(d) recovering said ammonia gas emerging from said ionic purifier unit and directing said ammonia gas to said workstation.

31. A method in accordance with claim 30 further comprising dissolving said ammonia gas emerging from said scrubber in purified water prior to directing said ammonia gas to said workstation.

32. A method in accordance with claim 30 further comprising passing said ammonia gas through a distillation column for further purification prior to directing said ammonia gas to said workstation.

33. A method in accordance with claim 30 further comprising the additional step of:
(b') passing said ammonia gas from said scrubber through a distillation column for further purification, and dissolving said ammonia gas emerging from said distillation column in purified water prior to directing said ammonia gas to said workstation.

34. A method in accordance with claim 33 in which steps (b) and (b') are conducted at a temperature ranging from about 15° to about 35° C.

35. A method in accordance with claim 33 in which steps (b) and (b') are conducted at a temperature ranging from about 15° to about 35° C. and at a pressure of from about atmospheric pressure to about 30 psi above atmospheric pressure.

36. A method in accordance with claim 30 in which step (b) is conducted at a temperature ranging from about 10° to about 50° C.

37. A method in accordance with claim 36 in which step (b) is conducted at a temperature ranging from about 15° to about 35° C.

38. A method in accordance with claim 30 in which step (b) is conducted at a temperature ranging from about 15° to about 35° C. and at a pressure of from about atmospheric pressure to about 30 psi above atmospheric pressure.

39. A system for the preparation of ultra-high-purity ammonia, comprising:
an evaporation source connected to receive a liquid ammonia source and to provide a flow of ammonia vapor therefrom;
said flow of ammonia vapor being connected to pass through a unit which provides a recirculating volume of high-purity water, containing a high concentration of ammonium hydroxide, in contact with said flow of ammonia vapor, to produce a purified ammonia gas;
said unit having an outlet for removing said purified ammonia gas emerging from said unit.

* * * * *